(12) United States Patent
Okazaki et al.

(10) Patent No.: US 11,763,139 B2
(45) Date of Patent: Sep. 19, 2023

(54) NEUROMORPHIC CHIP FOR UPDATING PRECISE SYNAPTIC WEIGHT VALUES

(71) Applicant: INTERNATIONAL BUSINESS MACHINES CORPORATION, Armonk, NY (US)

(72) Inventors: Atsuya Okazaki, Setagaya-ku (JP); Masatoshi Ishii, Yokohama (JP); Junka Okazawa, Yamashina-ku (JP); Kohji Hosokawa, Ohtsu (JP); Takayuki Osogami, Yamato (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1342 days.

(21) Appl. No.: 15/875,604

(22) Filed: Jan. 19, 2018

(65) Prior Publication Data

US 2019/0228287 A1    Jul. 25, 2019

(51) Int. Cl.
    *G06N 3/049* (2023.01)
    *G06N 3/065* (2023.01)
    (Continued)

(52) U.S. Cl.
    CPC ............. *G06N 3/049* (2013.01); *G06N 3/065* (2023.01); *G06N 3/08* (2013.01); *G06N 3/084* (2013.01);
    (Continued)

(58) Field of Classification Search
    CPC ........ G06N 3/049; G06N 3/0635; G06N 3/08; G11C 11/54
    See application file for complete search history.

(56) References Cited

U.S. PATENT DOCUMENTS 9,552,546 B1 *  1/2017  Piekniewski .......... G06N 3/049
2014/0188771 A1  7/2014  Modha
(Continued)

FOREIGN PATENT DOCUMENTS

CN    102610274 B    10/2014
CN    106201651 A    12/2016
(Continued)

OTHER PUBLICATIONS

Burr, G. W., Narayanan, P., Shelby, R. M., Sidler, S., Boybat, I., di Nolfo, C., & Leblebici, Y. (Dec. 2015). Large-scale neural networks implemented with non-volatile memory as the synaptic weight element: Comparative performance analysis (accuracy, speed, and power). In 2015 IEEE (pp. 4-4) IEEE.*

(Continued)

*Primary Examiner* — Ying Yu Chen
*Assistant Examiner* — Lokesha G Patel
(74) *Attorney, Agent, or Firm* — Tutunjian & Bitetto, P.C.; Randy Emilio Tejeda

(57) ABSTRACT

A neuromorphic chip includes synaptic cells including respective resistive devices, axon lines, dendrite lines and switches. The synaptic cells are connected to the axon lines and dendrite lines to form a crossbar array. The axon lines are configured to receive input data and to supply the input data to the synaptic cells. The dendrite lines are configured to receive output data and to supply the output data via one or more respective output lines. A given one of the switches is configured to connect an input terminal to one or more input lines and to changeably connect its one or more output terminals to a given one or more axon lines.

20 Claims, 10 Drawing Sheets

(51) Int. Cl.
*G06N 3/08* (2023.01)
*G06N 3/088* (2023.01)
*G11C 13/00* (2006.01)
*G06N 3/084* (2023.01)
*G11C 29/02* (2006.01)
*H10N 70/20* (2023.01)
*G11C 11/54* (2006.01)

(52) U.S. Cl.
CPC .............. *G06N 3/088* (2013.01); *G11C 11/54* (2013.01); *G11C 13/0002* (2013.01); *G11C 13/003* (2013.01); *G11C 29/028* (2013.01); *H10N 70/231* (2023.02); *G11C 2213/77* (2013.01)

(56) References Cited

U.S. PATENT DOCUMENTS

| | | | |
|---|---|---|---|
| 2016/0125287 A1 | 5/2016 | Pantazi et al. | |
| 2016/0155047 A1* | 6/2016 | Esser | G06F 9/44505 706/29 |
| 2016/0267379 A1 | 9/2016 | Eleftheriou et al. | |
| 2016/0336064 A1* | 11/2016 | Seo | G06N 3/088 |
| 2016/0350647 A1 | 12/2016 | Hosokawa et al. | |
| 2017/0154257 A1 | 6/2017 | Cao et al. | |
| 2017/0193358 A1* | 7/2017 | Lee | G06N 3/0635 |

FOREIGN PATENT DOCUMENTS

| | | | |
|---|---|---|---|
| CN | 107111783 A | 8/2017 | |
| JP | 2017538994 A | 12/2017 | |
| JP | 2019505065 A | 2/2019 | |

OTHER PUBLICATIONS

Adhikari, S. P., Yang, C., Kim, H., & Chua, L. O. (2012). Memristor bridge synapse-based neural network and its learning. IEEE Transactions on neural networks and learning systems, 23(9), 1426-1435. (Year: 2012).*

Potok, Thomas E., et al. "A Study of Complex Deep Learning Networks on High Performance, Neuromorphic, and Quantum Computers." ArXiv.org, Jul. 13, 2017, https://arxiv.org/abs/1703.05364v2. (Year: 2017).*

Burr, G. W., Narayanan, P., Shelby, R. M., Sidler, S., Boybat, I., Di Nolfo, C., & Leblebici, Y. (Dec. 2015). Large-scale neural networks implemented with non-volatile memory as the synaptic weight element: Comparative performance analysis (accuracy, speed, and power). In 2015 IEEE (pp. 4-4) IEEE (Year: 2015).*

Soudry, D., Di Castro, D., Gal, A., Kolodny, A., & Kvatinsky, S. (2015). Memristor-based multilayer neural networks with online gradient descent training. IEEE transactions on neural networks and learning systems, 26(10), 2408-2421. (Year: 2015).*

International Search Report Issued in PCT/IB2019/050096 dated Mar. 28, 2019, 9 pages.

Fumarola, A. et al., "Accelerating machine learning with Non-Volatile Memory: Exploring device and circuit tradeoffs" 2016 IEEE International Conference on Rebooting Computing (ICRC) (Nov. 2016) pp. 1-8.

Burr, G.W. et al., "Large-scale neural networks implemented with non-volatile memory as the synaptic weight element: comparative performance analysis (accuracy, speed, and power)" 2015 IEEE International Electron Devices Meeting (IEDM) (Feb. 2016) pp. 4.4.1-4.4.4.

Burr, G.W. et al., "Experimental Demonstration and Tolerancing of a Large-Scale Neural Network (165 000 Synapses) Using Phase-Change Memory as the Synaptic Weight Element" IEEE Transactions on Electron Devices (Nov. 2015) pp. 3498-3507, vol. 62, No. 11.

Burr, G.W. et al., "Neuromorphic computing using non-volatile memory" Advances in Physics (Dec. 2016) pp. 89-124, vol. 2, No. 1.

Kim, S. et al., "NVM Neuromorphic Core with 64k-cell (256-by-256) Phase Change Memory Synaptic Array with On-Chip Neuron Circuits for Continuous In-Situ Learning" 2015 IEEE International Electron Devices Meeting (IEDM) (Dec. 2015) pp. 17.1.1-17.1.4.

Shelby, R.M. et al., "Non-volatile Memory as Hardware Synapse in Neuromorphic Computing: A First Look at Reliability Issues" 2015 IEEE International Reliability Physics Symposium (IRPS) (Apr. 2015) pp. 6A.1.1-6A.1.6.

Sidler, S. et al., "Large-scale neural networks implemented with non-volatile memory as the synaptic weight element: impact of conductance response" 2016 46th European Solid-State Device Research Conference (ESSDERC) (Sep. 2016) pp. 440-443.

Notice of Reasons for Refusal issued in corresponding Japanese Patent Application No. 2020-537463 dated Jun. 30, 2022, pp. 1-5.

Office Action from CN201980008114.1 dated Apr. 25, 2023. (24 pages).

* cited by examiner

NEUROMORPHIC CHIP FOR UPDATING PRECISE SYNAPTIC WEIGHT VALUES

BACKGROUND

Technical Field

The present invention relates to a neuromorphic chip, and a system for updating precise synaptic weight values thereof.

Description of the Related Art

Hardware neuromorphic chip implementations, such as non-volatile memory (NVM)-based neuromorphic chips, are emerging. Such neuromorphic chips can be implemented in neural networks such as spiking neural networks (SNNs) and deep neural networks (DNNs). In SNN, synaptic connections can be updated by a local learning rule such as spike-timing-dependent-plasticity (STDP) to implement a computational approach modeled after biological neurons. In DNN, neuromorphic chips can also represent matrices of synaptic weights, implementing multiply-accumulate (MAC) operations needed for algorithms such as backpropagation in an analog yet massively-parallel fashion.

SUMMARY

According to one aspect of the present invention, a neuromorphic chip is provided. The neuromorphic chip includes a plurality of synaptic cells including respective resistive devices, a plurality of axon lines, a plurality of dendrite lines, and a plurality of switches each including an input terminal and one or more output terminals. The synaptic cells are connected to the axons and the dendrites to form a crossbar array. The axon lines are configured to receive input data and to supply the input data to the synaptic cells. The dendrite lines are configured to receive output data and to supply the output data via one or more respective output lines. A given one of the switches is configured to connect its input terminal to one or more input lines and to changeably connect its one or more output terminals to a given one or more of the axon lines.

According to another aspect of the present invention, a neuromorphic system is provided. The neuromorphic system includes a neuromorphic chip and a controller. The neuromorphic chip includes a plurality of synaptic cells including respective resistive devices, a plurality of axon lines, a plurality of dendrite lines, and a plurality of switches each including an input terminal and one or more output terminals. The synaptic cells are connected to the axons and the dendrites to form a crossbar array. The axon lines are configured to receive input data and to supply the input data to the synaptic cells. The dendrite lines are configured to receive output data and to supply the output data via one or more respective output lines. A given one of the switches is configured to connect its input terminal to one or more input lines and to changeably connect its one or more output terminals to a given one or more of the axon lines. The controller is configured to enable the given switch to changeably connect its input line to the given one or more axon lines according to a requirement of an application being deployed on the system, and perform a learning operation with the input data via the given one or more axon lines by expressing a single weight with a preferred number of resistive elements of the synaptic cells.

In one embodiment, the given switch changeably connects its one or more output terminals to the one or more given axon lines to assign a synaptic weight to one or more given synaptic cells associated with the one more given axon lines.

In one embodiment, the neuromorphic chip further includes one or more pre-synaptic neurons for supplying the input data to the axon lines via the switches. Each of the pre-synaptic neurons has an input end and an output end, and the input terminal of the given switch respectively connects to the output end of a given one of the pre-synaptic neurons to supply the input data to the input terminal of the given switch.

According to yet another aspect of the present invention, a method for updating synaptic weights in a neuromorphic chip is provided. The method includes connecting respective input terminals of a plurality of switches of the neuromorphic chip to input lines of the neuromorphic chip and, for a given one of the switches, changeably connecting the given switch to a given one or more of a plurality of axon lines of the neuromorphic chip to assign a synaptic weight to a given one or more of a plurality of synaptic cells of the neuromorphic chip. The given one or more axon lines are configured to receive input data from a given one or more of the input lines and to supply the input data to the given synaptic cells. The synaptic cells are connected to the axon lines and a plurality of dendrite lines of the neuromorphic chip to form a crossbar array.

In one embodiment, the given switch changeably connects to the given one or more axon lines according to a requirement of an application being deployed on the neuromorphic system, and the method further includes performing a learning operation with the input data via the one or more given axons lines by expressing the weight with a preferred number of resistive elements of the one or more given synaptic cells.

The summary section does not necessarily describe all necessary features of the embodiments of the present invention. The present invention may also be a sub-combination of the features described above.

DETAILED DESCRIPTION

Hereinafter, exemplary embodiments of the present invention will be described in detail with reference to the drawings.

It is to be noted that the present invention is not limited to the exemplary embodiments to be given below and may be implemented with various modifications within the scope of the present invention. In addition, the drawings used herein are for purposes of illustration, and do not show actual dimensions.

Typically, an analog cell of a neuromorphic chip can express a (continuous) synaptic weight value. Fine updates of the weight values can be necessary during learning phases for the neuromorphic chip. However, due to device variability, it can be hard to precisely update the synaptic weight value per cell within a level of accuracy. A peripheral circuit can be used to control the synaptic weight value within the level of accuracy to eventually attain recognition operation close to an expected value. At the same time, without the complicated peripheral circuit, the hardware neuromorphic chip implementation requires not to affect inherent advantage in either training power or speed. Moreover, there can be problems associated with updating synaptic weights due to variations of electric parameters, e.g., conductance, resistance, and capacitance.

Figure 1:
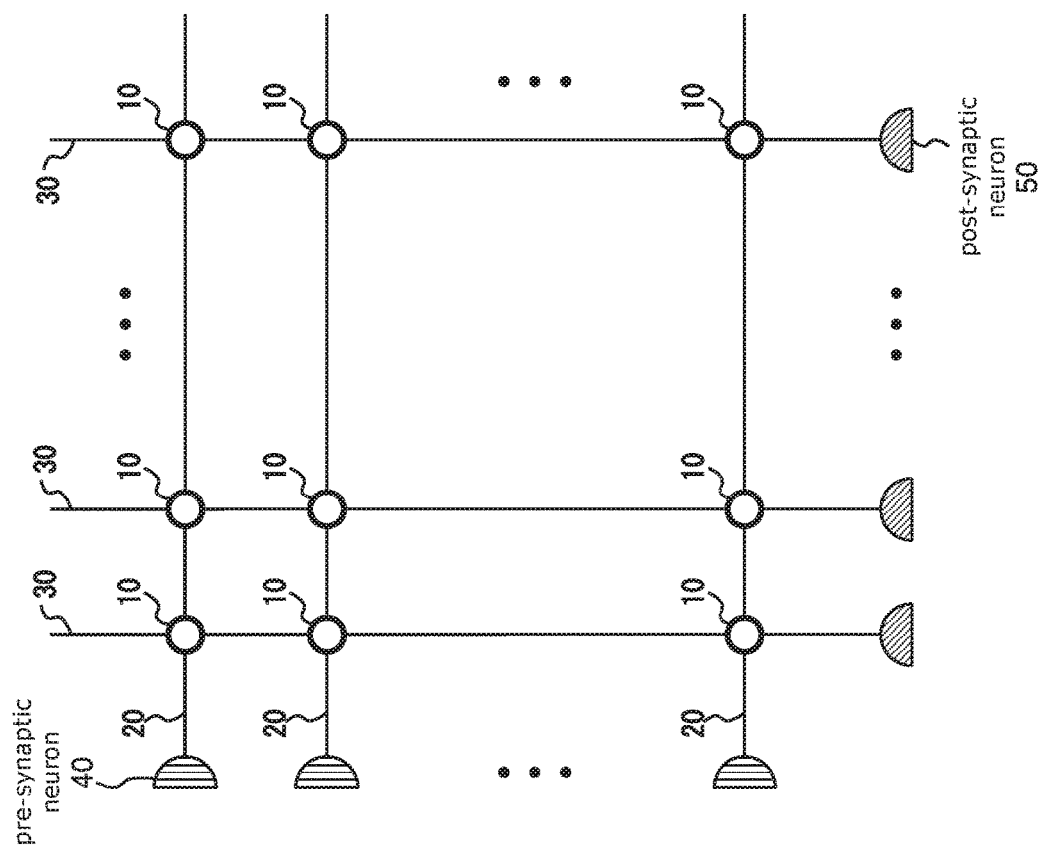
FIG. 1 shows a diagram illustrating an exemplary overview of a neuromorphic chip, according to an embodiment of the present invention.

Referring to FIG. 1, an exemplary overview of a crossbar array 100 of a neuromorphic chip is provided. The crossbar array 100 can include synaptic cells 10, axons 20 and dendrites 30. A synaptic cell can also be referred to as a resistive cell or a synaptic memory cell (e.g., non-volatile memory (NVM) cell). Non-limiting examples of NVM include phase change memory (PCM) and flash memory. Each of synaptic cells 10 can include two kinds of memory cells to enable recording of analog data and/or digital data.

As shown, the synaptic cells 10 are placed at all cross points of the axons 20 and the dendrites 30 to form the crossbar array 100. Thus, each synaptic cell 10 is associated with a respective axon-dendrite pair. A synaptic cell 10 may store a synapse weight value associated with a synaptic state, which indicates a synaptic weight between its respective axon-dendrite pair.

One end of each axon 20 is connected to a corresponding pre-synaptic neuron 40, and one end of each dendrite 30 is connected to a corresponding post-synaptic neuron 50. The pre-synaptic neurons 40 pass input data to respective ones of the synaptic cells 10 through the axons 20. The post-synaptic neurons 50 receive output data from respective ones of the synaptic cells 10 through the dendrites 30.

Due to device variability, crossbar arrays that include resistive devices have difficulty in holding high-resolution resistance of synaptic weight per synaptic cell. Precise synaptic weight update of the crossbar arrays needs to become available. As will be described herein, a single synaptic weight value can be expressed with a variable number of resistive device based synaptic cells.

The crossbar array 100 represents one possible implementation for massively-parallel and energy-efficient neuromorphic computing systems. The crossbar array 100 is modeled after biological neural networks, such as that described in FIG. 2.

Figure 2:
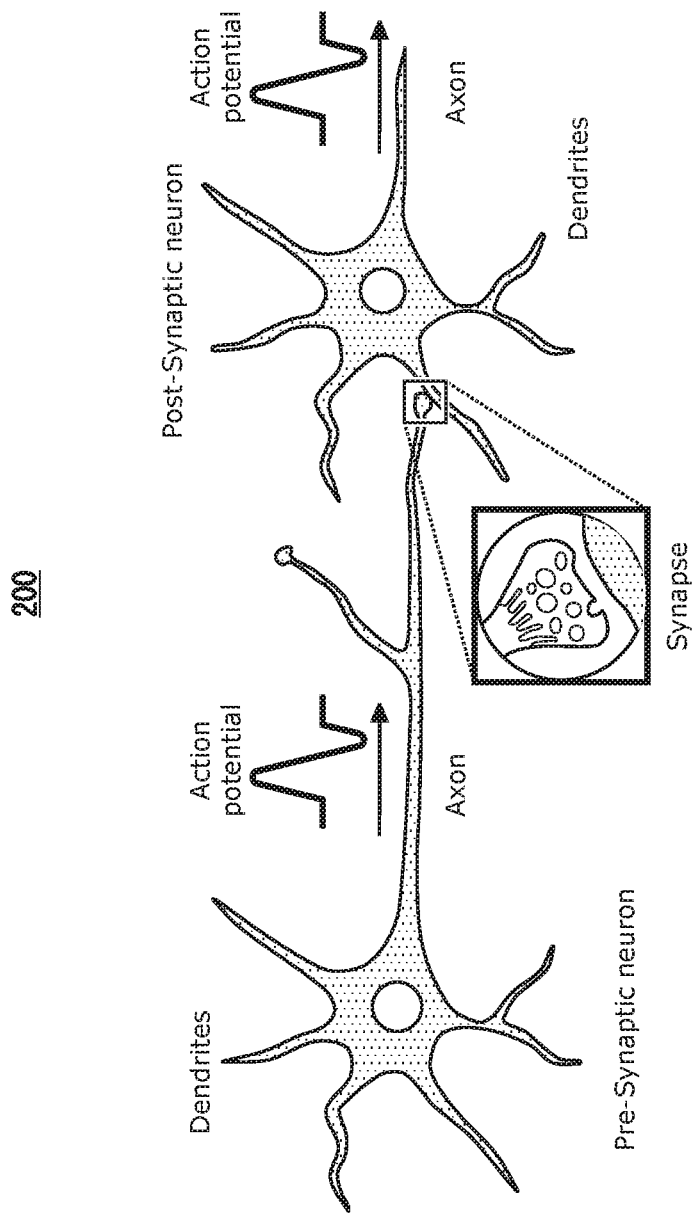
FIG. 2 shows a diagram illustrating an exemplary transition of action potentials from a pre-synaptic biological neuron to a post-synaptic biological neuron.

Referring to FIG. 2, a diagram 200 is shown illustrating an exemplary transition of action potentials from a pre-synaptic biological neuron to a post-synaptic biological neuron. A typical transition of a biological synaptic action potential is illustrated, as can be observed in hippocampal glutamatergic synapses. The weight connections between axons and dendrites, and the transition of action potentials between a pre-synaptic neuron and a post-synaptic neuron are shown. The pre-synaptic neuron may propagate the action potential to the post-synaptic neuron via the axon with weighted potential at the synapse. In biology, excitatory and inhibitory post-synaptic potentials are delivered from one neuron to the next neuron through chemical and electrical messaging at synapses, driving the generation of new action potentials.

Figure 3:
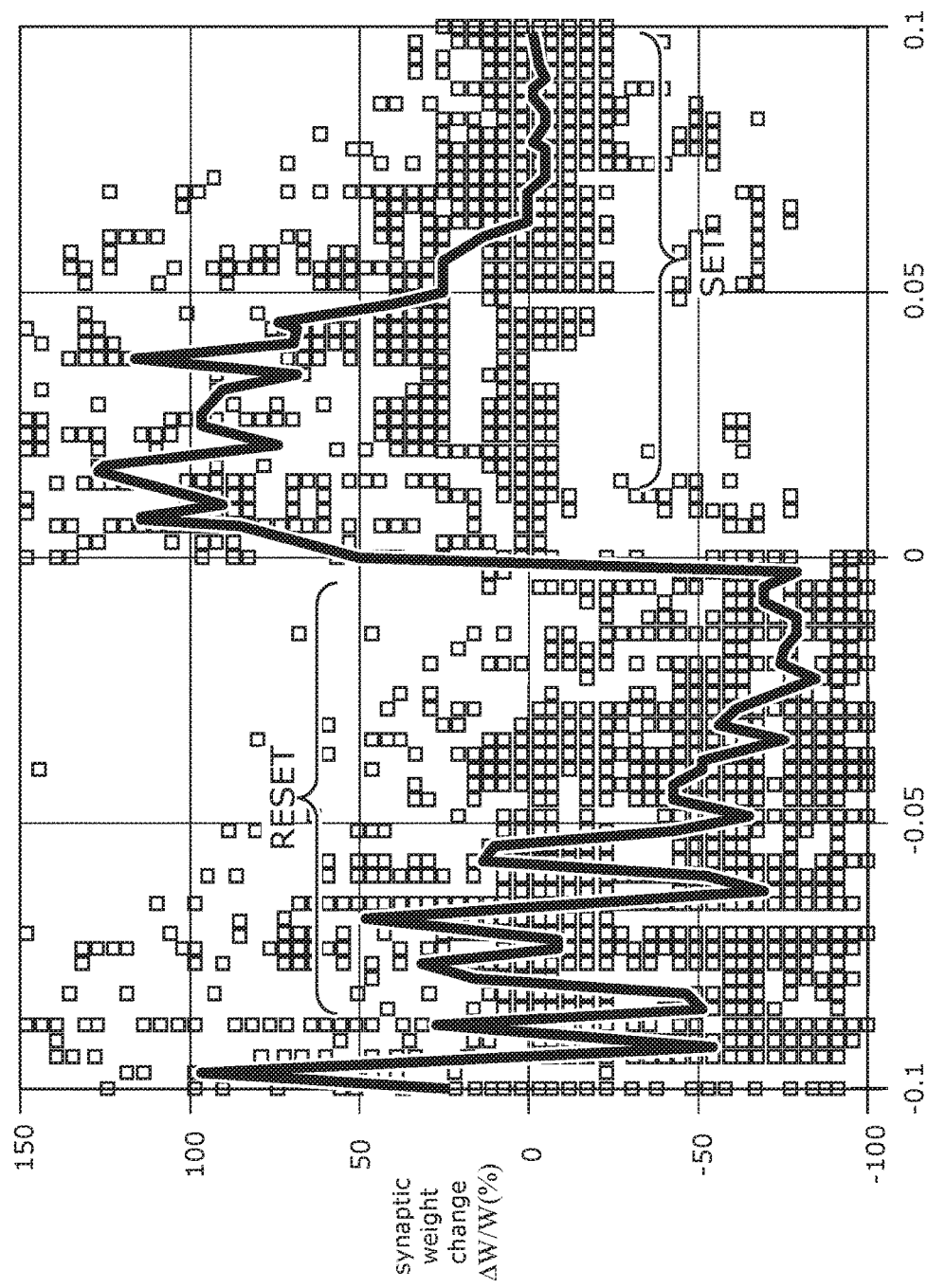
FIG. 3 shows a chart illustrating, in each synaptic cell of an array, an exemplary synaptic weight change, according to an embodiment of the present invention.

Referring to FIG. 3, a chart 300 is shown illustrating, in each synaptic cell of an array, an exemplary synaptic weight change. The synaptic weight change ΔW is dependent on relative spike timing between a pre-synaptic neuron and a post-synaptic neuron in a hardware implementation of spike-timing-dependent-plasticity (STDP). NVM based synaptic weight can fluctuate abruptly in an analog manner, such as in the biological case. The neuromorphic crossbar array on-chip neuron circuits can perform leaky integrate and fire (LIF) and synaptic weight update based on STDP, avoiding additional complication and power consumption associated with timing schemes.

Figure 4B:
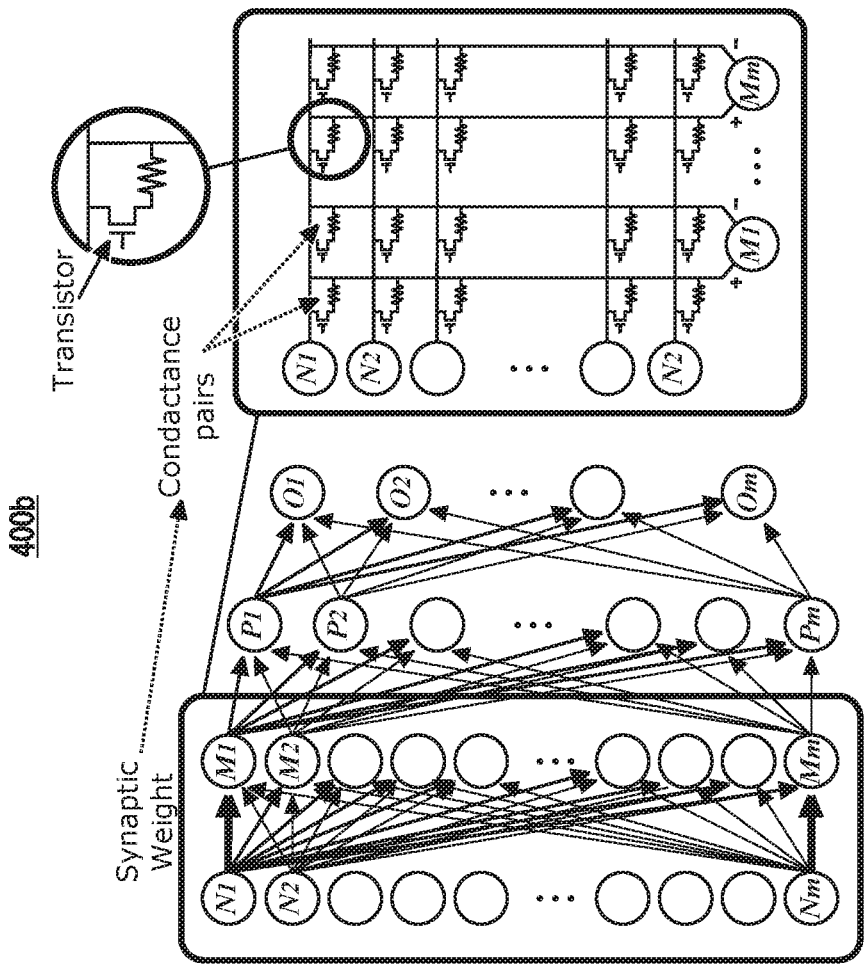
FIG. 4B shows a diagram illustrating an exemplary hardware implementation of a deep neural network (DNN), according to an embodiment of the present invention.
Figure 4A:
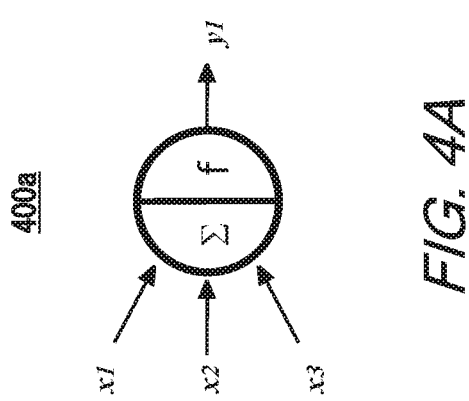
FIG. 4A shows a diagram illustrating exemplary downstream neuron excitation through a multiply accumulate (MAC) operation.

Referring to FIG. 4A, a diagram 400a is provided illustrating an exemplary downstream neuron excitation, such as downstream neuron excitation of a DNN. The downstream neuron excitation depends on the weight excitation of all upstream neurons. Input data (e.g., x1, x2 and x3) is obtained, and is accumulated to a current neuron (Σ). In one embodiment, the input data is accumulated through a multiply accumulate (MAC) operation. In accumulating the input data through the MAC operation, each of the synapses multiplies the input data with each weight, then the current neuron accumulates the weighted input data to generate an output data (e.g., y1) based on one or more activation functions (f).

Referring to FIG. 4B, a diagram 400b is provided illustrating an exemplary hardware implementation of a DNN. Each of the post-synaptic neurons (M1, M2, . . . , Mm) receives output data weighted through the synaptic cells from the pre-synaptic neurons (N1, N2, . . . , Nm). Then, the weighted output data is supplied as input data to a subsequent neuron (P1, P2, . . . , Pm) layer. The MAC operation featured in both forward-inference and backpropagation of DNNs can be implemented as vector-matrix multiplication on large NVM-based arrays. The crossbar array of synaptic cells with NVM (conductance) and transistor pairs is ideally suited for the MAC operations at the heart of DNN learning. The multiply operation can be performed at every crossbar in accordance with Ohm's law, and the current summation along rows or columns can be performed in accordance with Kirchhoff's current law.

Figure 5:
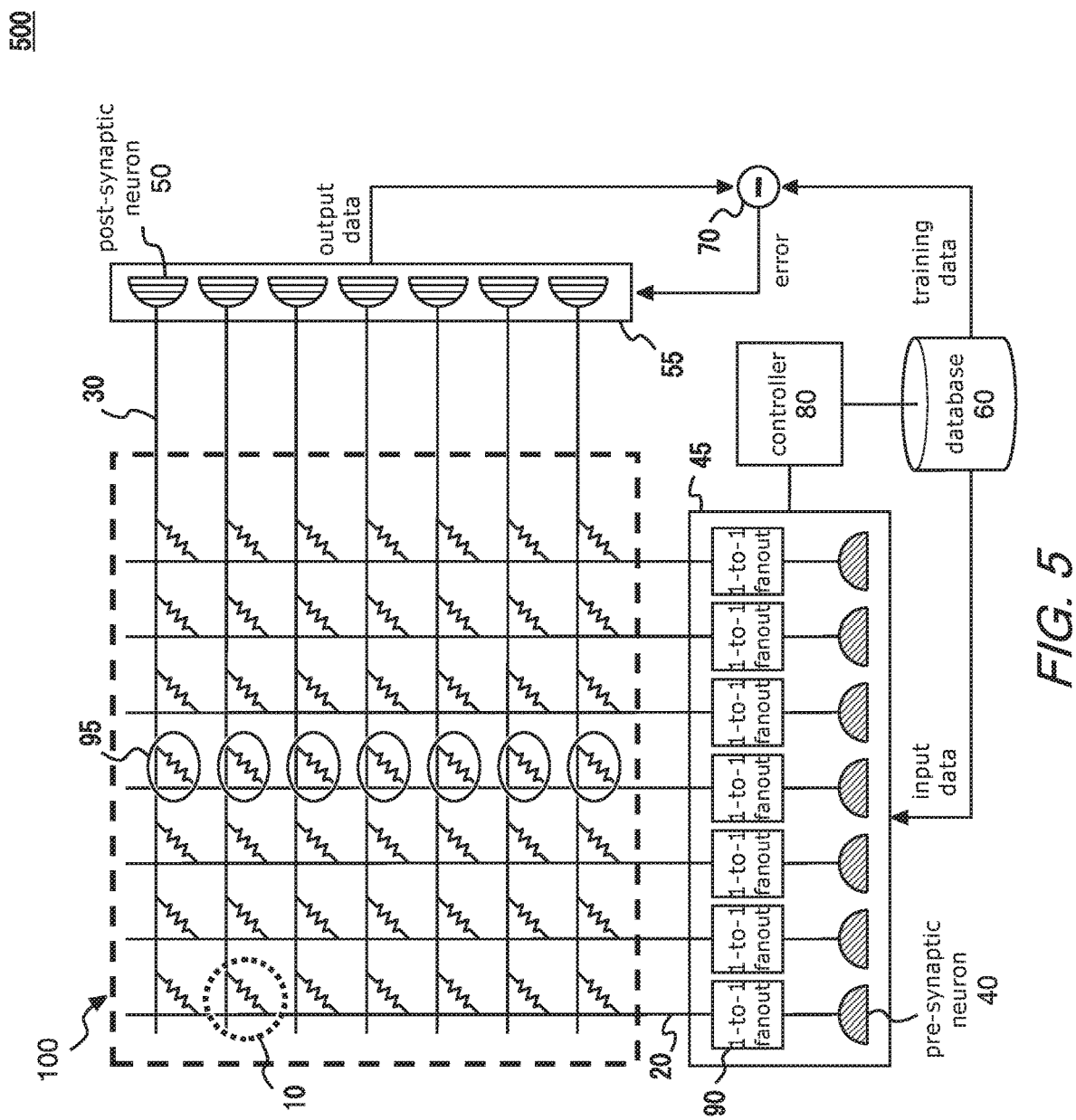
FIG. 5 shows a neuromorphic system, according to an embodiment of the present invention.

Referring now to FIG. 5, an exemplary neuromorphic system 500 is shown. System 500 includes a crossbow array 100 that includes synaptic cells, including synaptic cell 10. The crossbar array 100 is applicable to various kinds of implementations, including but not limited to SNN, DNN, dynamic Boltzmann machine (DyBM), contrastive divergence, and gradient descent. The synaptic cells are comprised of one or more resistive devices, which can include volatile memory, NVM, and/or a condenser. The synaptic cells are connected in parallel and in series with axon lines 20 and dendrite lines 30, with the synaptic cells being arranged at each intersection of the lattice network, as shown. Pre-synaptic neurons (e.g., pre-synaptic neuron 40) of an array of pre-synaptic neurons 45 are connected to post-synaptic neurons (e.g., post-synaptic neuron 50) of an array of post-synaptic neurons 55 via the synaptic cells, which respectively have a unique conductance value. The pre-synaptic neurons and post-synaptic neurons may include circuitry configured to implement the pre-synaptic and post-synaptic neurons, respectively.

The system 500 further includes switches (e.g., switch 90) aligned along the input interface side of the crossbar array 100 to implement switching functions. The switches can be "one-to-n" fanout switches embedded to implement fanout switching functions, where n is a natural number. In this illustrative embodiment, the switches are 1-to-1 fanout switches, in which each synaptic cell is assigned a single synaptic weight. The switches can include input terminals connected to respective output ends of the pre-synaptic neurons, and output terminals connected to respective ones of the axon lines (e.g., switch 90 includes an input terminal connected to pre-synaptic neuron 40 and an output terminal connected to axon line 20). The switches are used to changeably connect one input line of the pre-synaptic neuron to the axon lines 20 in order to express a single synaptic weight with one or more resistive cells 95. Accordingly, the switches can be used to selectively connect each of the input lines of the pre-synaptic neurons to one of the axon lines to assign, as a synaptic weight, one resistive cell as specified by one circle 95 shown in the FIG. 5.

Although the switches are shown in FIG. 5 as being within the pre-synaptic neuron array 45, one or more of the switches may be included outside of the pre-synaptic array 45. The switches may be embedded into the neuromorphic chip with ASIC or FPGA. Accordingly, it is possible to streamline the process of manufacturing the neuromorphic system including the fan-out switching functions.

According to the criteria of the weight value's accuracy required for a given application (e.g., image data classification, image recognition or voice recognition), the controller 80 can aggregate two or more axon lines for one output end of the pre-synaptic neuron 40.

Input lines of post-synaptic neurons may be connected to respective ones of the dendrite lines (e.g., post-synaptic neuron 50 is connected to dendrite line 30).

The system 500 can be a hardware apparatus that performs learning based on input data, output data and training data. Furthermore, the system 500 may be operable to perform testing and make predictions for output data corresponding to the input data, based on the learning results. The system 500 adjusts synaptic weights in a manner to reduce the difference between output data that is output in response to the input data and training data corresponding to the input data.

System 500 is not limited to the illustrative embodiment depicted in FIG. 5. For example, although the crossbar array 100 is shown including seven axon lines and seven dendrite lines, the numbers of axon lines and dendrite lines are not considered limiting. Additionally, the number of axon lines and the number of dendrite lines may be different.

The weight value (e.g., conductance) of each synaptic cell may be changed with the input data repeatedly applied from the pre-synaptic neurons. This change in the weight of each synaptic cell results in learning within the crossbar array 100.

The system 500 is further shown including a controller 80, a database 60 that stores training data, and a comparing section 70. The controller 80 may be operable to generate the input data and supply the crossbar array 100 with the input data. If the crossbar array 100 is performing learning, the controller 80 may generate training data corresponding to the input data, and supply the crossbar array 100 with this input data and training data. Furthermore, when the crossbar array 100 performs a test, makes a prediction, etc. based on learning results, the controller 80 can generate input data for testing and supply the crossbar array 100 with this input data. For example, in the case of SNN, the input data can include a time-series data sequence in which a plurality of pieces of data are arranged according to a time axis, such as audio data, video data, etc.

The controller 80 can read and acquire input data stored in a predetermined format (e.g., 28×28 pixel format or time series of image data). Furthermore, the controller 80 can be connected to a network or the like and acquire input data and the like via the network. The controller 80 can store the acquired input data and the like in a storage apparatus or the like inside the system 500.

The controller 80 can be operable to provide the synaptic cells with input data from the database 60 via the pre-synaptic neuron array 45. For example, each pre-synaptic neuron 40 may be operable to supply the crossbar array 100 with an input signal corresponding to the input data. Each pre-synaptic neuron 40 may be operable to supply, with the input signal, one or more corresponding cells of the crossbar system 100.

In this illustrative embodiment, each of the synaptic cells may supply the other corresponding cells with a weighted signal. The output cell array of the crossbar array may be operable to output the output data based on the output value output from the post-synaptic neuron array 55. In a learning operation, for example, each synaptic cell is updated with weights corresponding to a respective output value output by each pre-synaptic neuron of the pre-synaptic neuron array 45 (e.g., synaptic cell 10 is updated with a weight corresponding to the output value output by pre-synaptic neuron 40). The crossbar array outputs the result obtained by performing a predetermined calculation as the output data.

The system 500 is further shown including a comparing section 70. The post-synaptic neuron array 55 may be operable to supply the comparing section 70 with the output data. The comparing section 70 may be operable to compare the expected output data output by the controller 80 to the output data supplied by the post-synaptic neuron array 55. For example, the comparing section 70 outputs the difference between the expected output data and the output data as an error. The comparing section 70 may supply the controller 80 with this error as a result of the comparison.

Furthermore, the comparing section 70 may be operable to perform a comparison operation if the system 500 performs a learning operation. The comparing section 70 may be operable to, if the system 500 is performing a test or making a prediction using learning results, output the output data of the post-synaptic neuron array 55 to the outside as-is. In this case, the comparing section 70 may be operable to output the output data to an external output apparatus such as a display, a storage apparatus, and an external apparatus such as the database 60. Otherwise, the comparing section 70 may be operable to output the output data to subsequent neuron layers as pre-synaptic neurons corresponding to the previous post-synaptic neurons.

The controller 80 may initiate the synaptic weights by setting randomized analog values to each of the synaptic cells. The controller 80 may be operable to set the plurality of weights of the synaptic cells 10 according to the comparison results of the comparing section 70. The comparing section 70 may be operable to set the plurality of weights such that the system 500 outputs the output data that is expected in response to the input data. The controller 80 may be operable to update the plurality of weights in a manner to further reduce the error between the output data output by the post-synaptic neuron array 55 in response to the training data being supplied to the pre-synaptic neuron array 45 and the expected output data that is expected for the training data. The comparing section 70 may be operable to operate if the system 500 is learning.

Accordingly, the crossbar array 100 described above may be included in a system 500 capable of learning by updating the weights of the synaptic cells of the crossbar array 100.

In inputting input data for testing, the system 500 can output test results or prediction results for the input data for testing with updated weights. Such a system 500 can simulate the learning operation and a testing operation by performing matrix calculations. Furthermore, if the crossbar array 100 is a physical device that outputs an output signal in response to an input signal, the crossbar array 100 can be implemented with the arrays of NVM-based synaptic cells in a manner of easy hardware installation.

Figure 6:
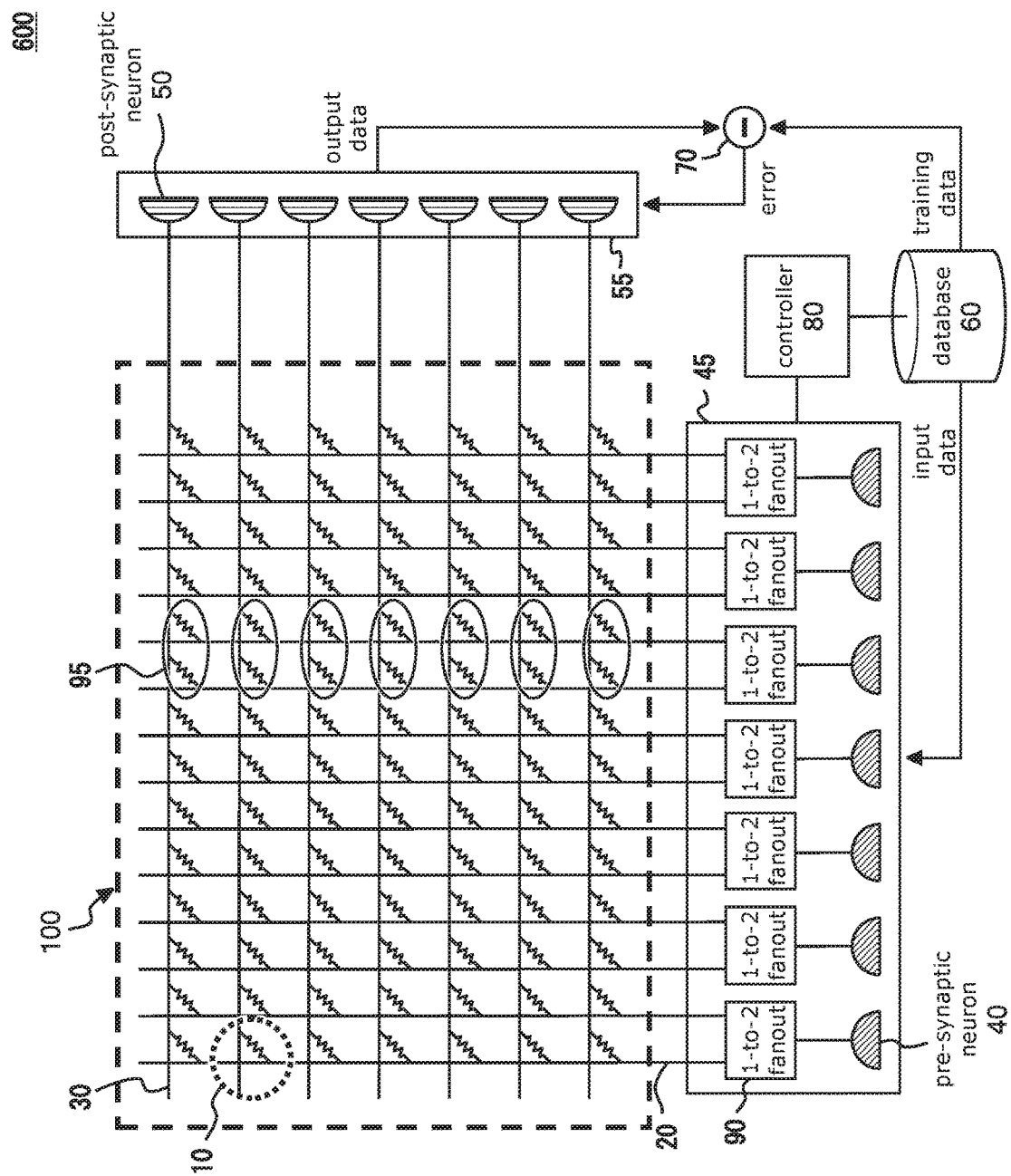
FIG. 6 shows a neuromorphic system, according to an alternative embodiment of the present invention.

Referring now to FIG. 6, another exemplary neuromorphic system 600 is shown. The configuration of system 600 is similar to the configuration of system 500 of FIG. 5. For example, system 600 includes a crossbar array 100 that includes synaptic cells (e.g., synaptic cell 10), axon lines (e.g., axon line 20) and dendrite lines (e.g., dendrite line 30), a set of pre-synaptic neurons 45 including pre-synaptic neurons (e.g., pre-synaptic neuron 40), a set of post-synaptic neurons 55 include post-synaptic neurons (e.g., post-synaptic neuron 50), database 60, comparing section 70 and controller 80.

However, in this illustrative embodiment of FIG. 6, the switches (e.g., switch 90) are 1-to-2 fanout switches, which assigns a pair of adjacent synaptic cells (e.g., circle 95) to a single synaptic weight. This enables a reduction in weight variability ($\Delta w_{min}$) required in applications as much as possible with dynamically changing the number of devices expressing a single weight.

According to the criteria of the weight value's accuracy required for the applications such as image data classification and image, or voice recognitions, the controller 80 aggregates two or more axon lines 20 for the output end of the pre-synaptic neuron. A pair of adjacent axon lines of the crossbar array 100 are connected to two output terminals each of the switches (e.g., a pair of adjacent axon lines include axon line 20 is connected to two output terminals of switch 90). Accordingly, the switches in the FIG. 6 embodiment enables the selective connection of two of the input lines to a pair of adjacent axon lines to assign, as a synaptic weight, a pair of adjacent synaptic cells (e.g., circle 95).

Such a switching function is used not only to various cognitive applications, but also to the compensation for highly precious weights despite device variability of the synaptic cells in the crossbar array 100. The controller 80 aggregates, for example, two axon lines 20 of adjacent resistive cells (e.g., circle 95). The aggregated adjacent cells compensate the variations of the synaptic weights influenced by unstable cells which hold fluctuated analog values in the crossbar array 100.

The controller 80 may manage the switches to select one or more input lines for a single line from each of the pre-synaptic neuron 40. For example, the switches may assign a single input line from each of the pre-synaptic neurons to one or more than 2 input lines of the neuromorphic chip 100.

Again, switch functions are not limited to the embodiments shown in FIGS. 5 and 6. For example, the following cases of the switch function may be applied to system 500:
 (1) 1-to-1 (non-adjacent) fan-out switch (e.g., FIG. 5)
 (2) 1-to-2 (adjacent) fan-out switch (e.g., FIG. 6)
 (3) 1-to-n (non-adjacent) fan-out switch, where n is a natural number of at least 2. In this case, a fan-out switch may connect a single input-line to non-adjacent pairs of two or more axon lines to assign two or more synaptic cells connected in parallel on the two axon lines as a single synaptic weight.
 (4) 1-to-n (adjacent, in parallel) fan-out switch, where n is a natural number of at least 3. In this case, a fan-out switch may connect a single line to an adjacent combination of three or more axon lines to assign three or more synaptic cells connected in parallel on the axon lines as single synaptic weight (Case 2 may be viewed as a subset of Case 4).

Figure 7:
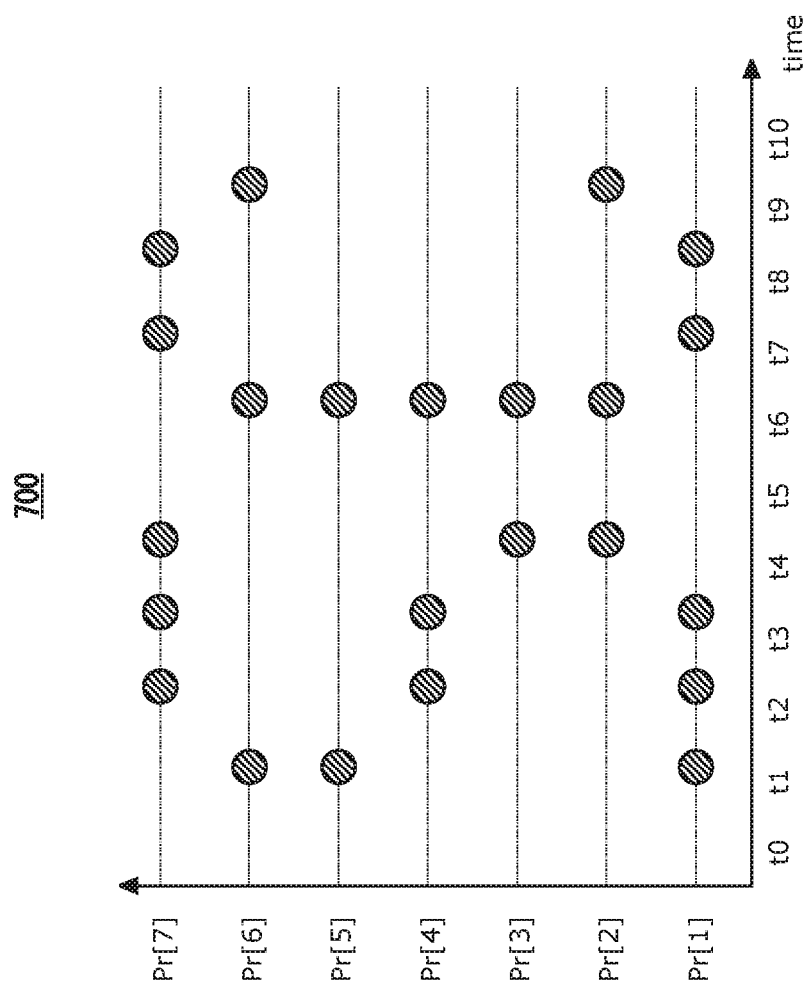
FIG. 7 shows a chart illustrating an exemplary relationship of an input pattern fed to input terminals of a neuromorphic chip, according to an embodiment of the present invention.

FIG. 7 shows a chart 700 illustrating an exemplary relationship of an input pattern fed to the input terminals of a crossbar array of a neuromorphic chip. The training data as shown in FIG. 7 is supplied to input terminals in time-series manner. In FIG. 7, the vertical axis indicates the input terminals Pr [1] to Pr [7] (e.g., pre-synaptic neurons) and the horizontal axis indicates time. The period from the time t0 to the time t10 corresponds to the normal operation phase. With the operation shown in FIG. 7, the neuron potential of each synaptic cell 10 until the time t10 may be monitored. In the normal operation phase, the action potential based on a given pattern is applied to the input terminals Pr[1] to Pr [7]. In FIG. 7, a dot is marked at each intersection where the action potential is applied to each of the input terminals Pr [1] to Pr [7] at the time tn.

As an example of image classification, the input data pattern "SC" of the action potential is fed to the input terminals Pr[1] to Pr[7] in the learning operation. The characters "SC", as the input data, may be fed through the pre-synaptic neurons 40. The input data pattern can be formatted with a dot scheme for DNN (e.g., 28×28 pixels), or with a time-series scheme for SNN. The input data is limited to not only static digitized data of handwritten digits (e.g., Modified National Institute of Standards and Technology (MNIST) database), but also a time-series data sequence in which plural pieces of data are arranged according to the time axis, such as audio data, video data, or the like. In DNN, the learning operation is performed with backpropagation on the database of handwritten digits or the pixel dotted character "SC" shown in FIG. 7.

Figure 8:
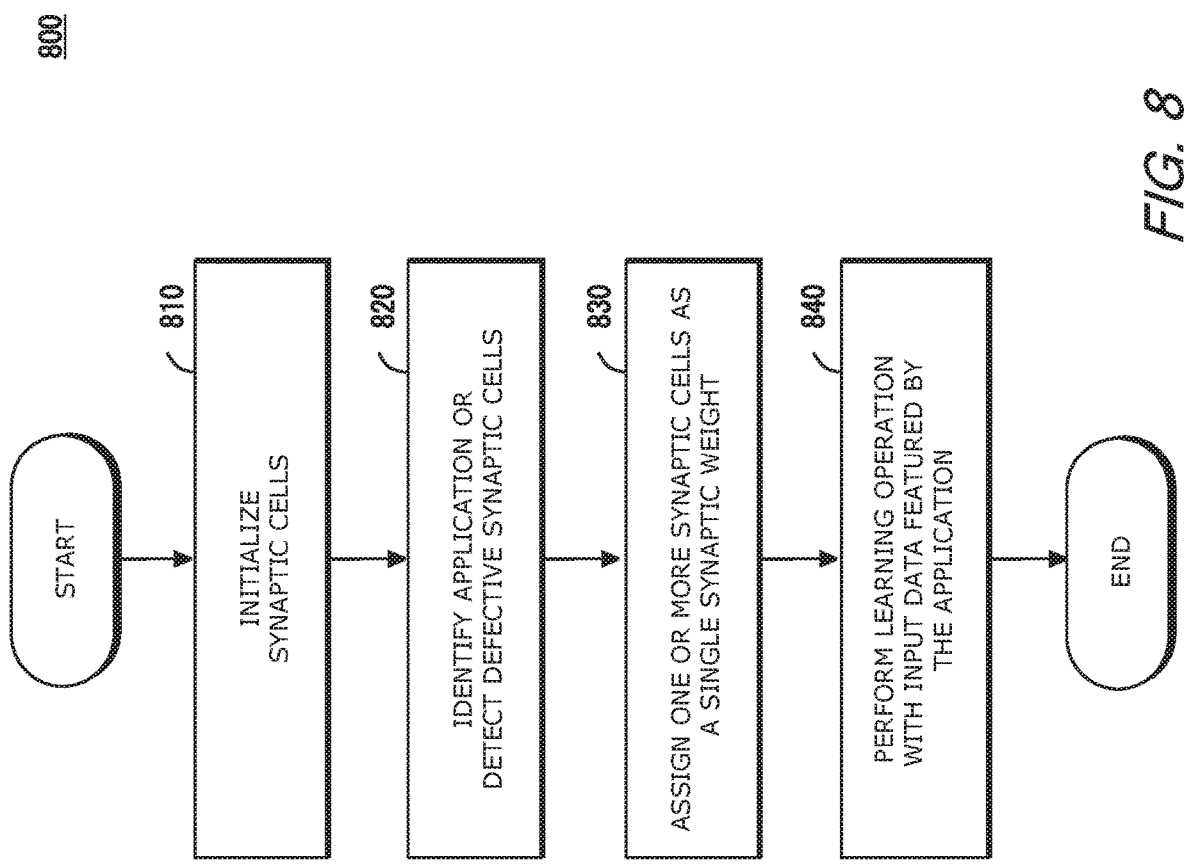
FIG. 8 shows a block/flow diagram illustrating an exemplary operational flow of a neuromorphic system, according to an embodiment of the present invention.

FIG. 8 shows block/flow diagram 800 illustrating an exemplary operational flow of a neuromorphic system. In one embodiment, the system is an NVM-based neuromorphic system operable to perform learning related processes from 810-840.

At block 810, a controller of the system initializes synaptic cells in a crossbar array of the neuromorphic system. Prior to starting the learning operation, the controller may observe the hardware condition of the synaptic cells. The system may dynamically change set a single synaptic weight by expressing not only a synaptic cell, such as NVM based synaptic cell, but also synaptic cells according to a resolution requirement for the application or hardware conditions.

At block 820, the controller identifies an application to deploy on the system before initiating the learning operation, or detects defective synaptic cells. For example, according to resolution (ΔR) of resistance (R) per NVM device required by one or more application or hardware conditions, the controller may determine to express a single weight by allotting how many synaptic cells to be used for mitigating requirement for the resolution per device.

At block 830, according to the one or more application or hardware conditions, the controller may assign one or more of the synaptic cells as a single synaptic weight. A switch function may be used to connect each single output of a pre-synaptic neuron to terminals of axon lines of the crossbar array. In one embodiment, the switch function is a "one-to-n fan-out" switch function, and the controller may manage the "one-to-n fan-out switch" to changeably select axon lines for a single input line corresponding to the output end of the pre-synaptic neurons. For example, each of the one-to-n fan-out switches may assign a single output input line of each of the pre-synaptic neurons to one or more input axon lines.

At block 840, the system 100 or its controller 80 may perform the learning operation with input data featured by the application. After assigning one or more of the NVM cells as a single synaptic weight, with mitigating weight variability during the learning operation, it is attainable to meet resolution of the weight value required for the application.

Figure 9:
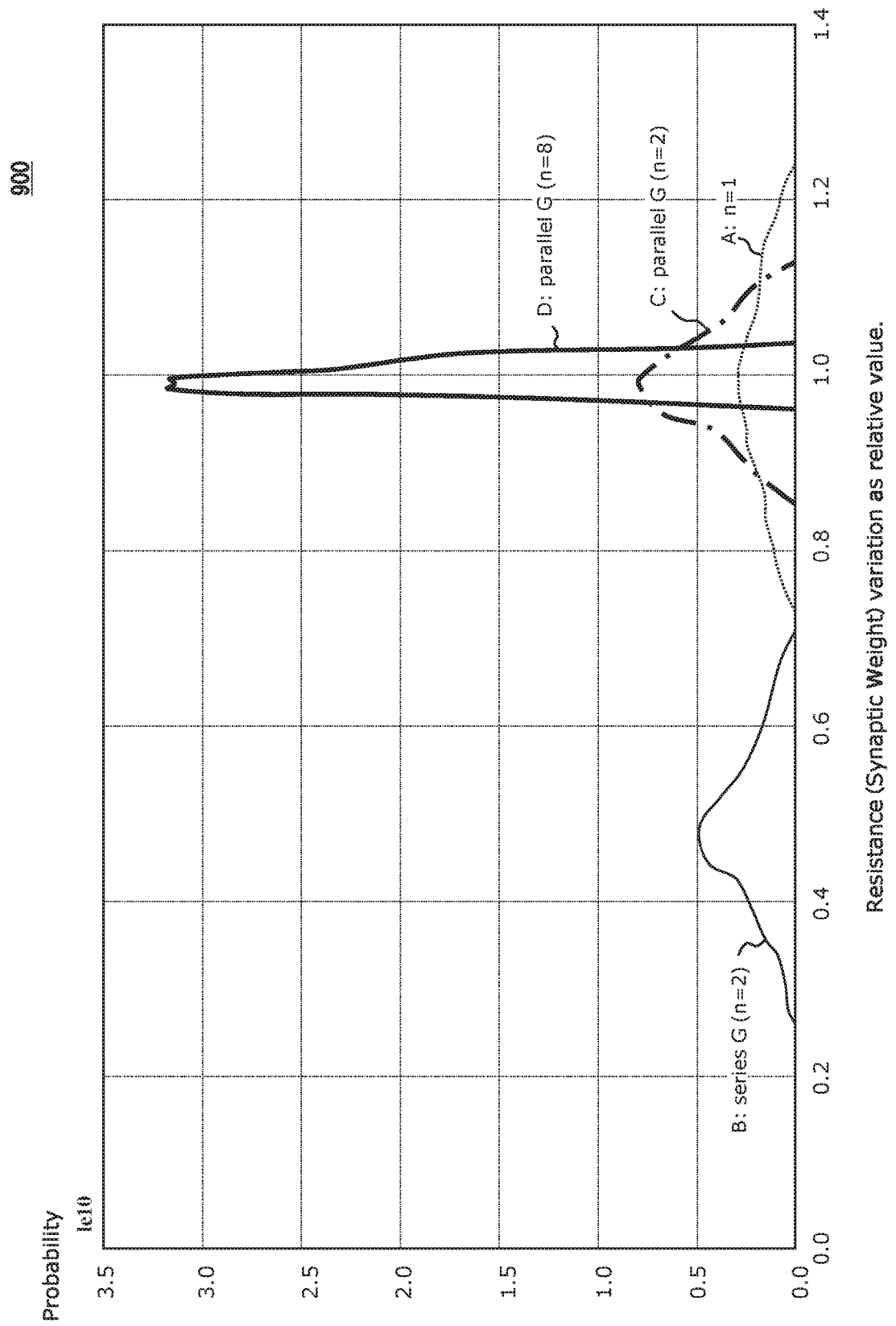
FIG. 9 shows an exemplary conductance variation related with a number of synaptic cells, according to an embodiment of the present invention.

FIG. 9 shows a chart 900 illustrating an exemplary conductance variation related with a number of synaptic cells. The x-axis denotes conductance G, which is an inverse of resistance (R), the y-axis denotes probability ratio to the conductance (G), and n refers to a number of synaptic cells associated with a single synaptic weight. Weight values are assumed to be proportional to the conductance of the synaptic cells, or inversely proportional to the resistance. In most cases, the more devices that a single synaptic weight is constituted with, the smaller distribution it shows. If a specific conductance value is required to form a single synaptic weight, FIG. 9 suggests that it is better to aggregate plural resistive elements or cells with minor resistance as many as possible to form a single synaptic weight. The following are the cases shown in chart 900:

(1) Case A, which shows a variation or distribution of one synaptic weight constituted with one synaptic cell.
(2) Case B, which shows a variation of one synaptic weight constituted with two synaptic cells in series.
(3) Case C, which shows a variation of one synaptic weight constituted with two synaptic cells in parallel.
(4) Case D, which shows a variation of one synaptic weight constituted with eight synaptic cells in parallel.

In the learning operation, the (NVM-based) neuromorphic system can set precise synaptic weight value with minor variation on the synaptic weights. As a concept of suppressing the variation of the synaptic weight, the more resistive devices that the synaptic weight includes, the higher tendency there is to make the synaptic weight variability gradually minor. If all of the synaptic cells of the crossbar array include resistive devices with equivalent quality regarding device variability per resistive device, the variation of the single synaptic weight (which is expressed with plural resistive cells) may be made considerably less than the variation per synaptic cell. In view of mitigating the requirement for variation per device, a single synaptic weight with plural resistive cells is beneficial to the neuromorphic hardware implementation.

As mentioned above, an inverse quantity of the resistance value (e.g., a conductance value) set to the resistor elements included in the synaptic cell may represent the weight. Also, the resistor elements used in the synaptic cell may have variable resistance values. For example, a single weight may be expressed by utilizing plural resistive devices to alleviate requirement for resolution of conductance per device. There are given typical embodiments of the neuromorphic hardware implementation to express a single weight value by assigning one, two, or more resistive elements. By dynamically assigning two or more resistive cells to a single synaptic weight, there are benefits to meet the resolutions of the resistance needed according to one or more applications that implement the neuromorphic system.

The embodiments described herein allow for the update of synaptic weights with high precision, even when it may be difficult to change the resistance of devices in small steps due to device characteristics (e.g., variations). Also, the neuromorphic chip implemented by the embodiments described herein is area-efficient and is beneficial to scalable circuits for various device variability.

Figure 10:
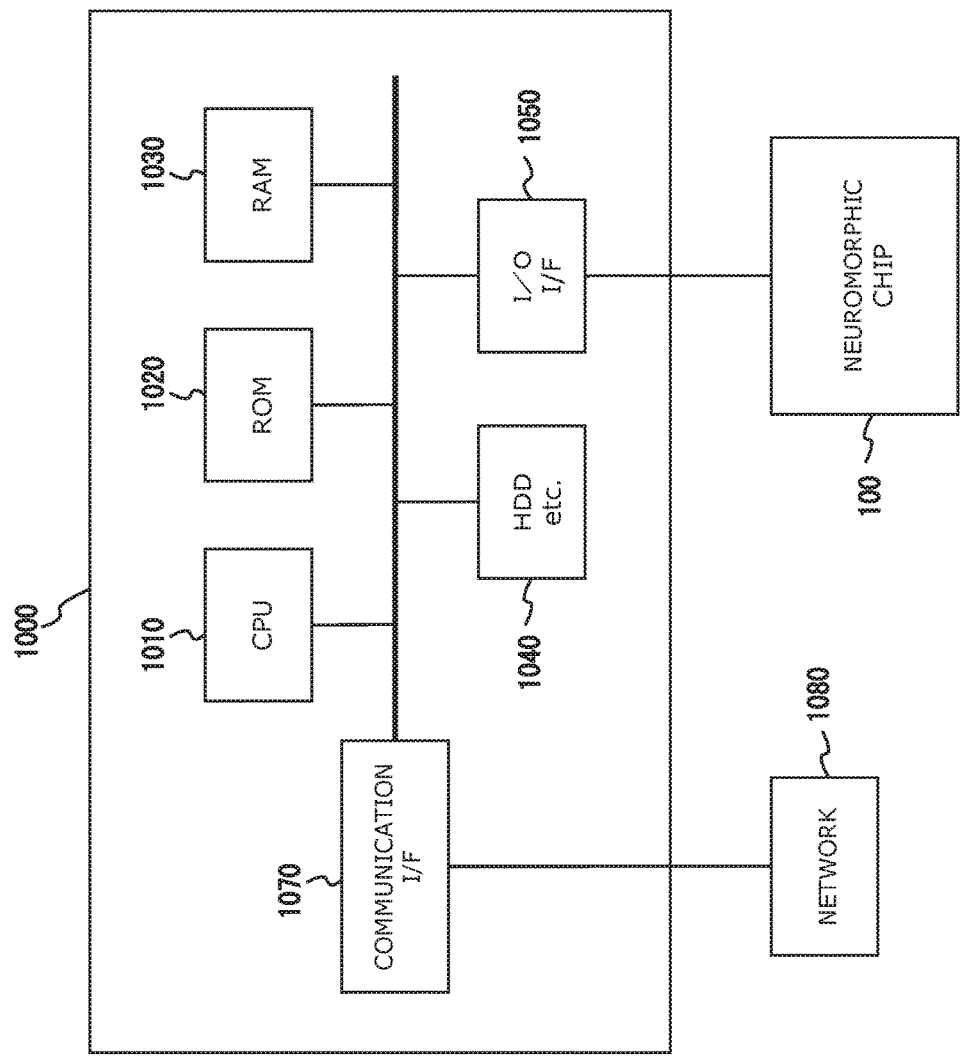
FIG. 10 shows an exemplary hardware configuration of a computer, according to an embodiment of the present invention.

FIG. 10 shows an exemplary hardware configuration of a computer according to the present embodiment. A program that is installed in the computer 1000 can cause the computer 1000 to function as or perform operations associated with the neuromorphic chip 100 of the embodiments of the present invention or one or more sections (including modules, components, elements, etc.) thereof, and/or cause the computer 1000 to perform processes of the embodiments of the present invention or steps thereof. Such a program may be executed by the CPU 1010 to cause the computer 1000 to perform certain operations associated with some or all the blocks of flowcharts and block diagrams described herein.

The computer 1000 according to the present embodiment includes a CPU 1010, a and RAM 1030. The computer 1000 also includes input/output units such as a I/O interface 1050, a hard disk drive 1040, which are connected to the host controller via an input/output controller. The computer also includes legacy input/output units such as a ROM 1020, which may be connected to the CPU.

The CPU 1010 operates according to programs stored in the ROM 1020 and the RAM 1030, thereby controlling each unit. The I/O interface 1050 communicates with other electronic devices via a network 1080. The hard disk drive 1040 stores programs and data used by the CPU 1010 within the computer 1000. The DVD-ROM drive reads the programs or the data from the DVD-ROM, and provides the hard disk drive 1040 with the programs or the data via the RAM 1030.

The ROM 1020 stores therein a boot program or the like executed by the computer 1000 at the time of activation, and/or a program depending on the hardware of the computer 1000.

A program is provided by computer readable media such as the DVD-ROM. The program is read from the computer readable media, installed into the hard disk drive 1040, RAM 1030, or ROM 1020, which are also examples of computer readable media, and executed by the CPU 1010. The information processing described in these programs is read into the computer 1000, resulting in cooperation between a program and the above-mentioned various types of hardware resources. The neuromorphic chip and its system 100, or method may be constituted by realizing the operation or processing of information in accordance with the usage of the computer 1000.

For example, when communication I/F 1070 is performed between the computer 1000 and a network 1080, the CPU 1010 may execute a communication program loaded onto the RAM 1030 to instruct communication processing to the communication interface 1070, based on the processing described in the communication program. The communication interface 1070, under control of the CPU 1010, reads transmission data stored on a transmission buffering region provided in a recording medium such as the RAM 1030, or the storage drive 1040 (e.g., the HDD, DVD-ROM drive or Flash drive), and transmits the read transmission data to network 1080 or writes reception data received from network 1080 to a reception buffering region or the like provided on the recording medium.

In addition, the CPU 1010 may cause all or a necessary portion of a file or a database to be read into the RAM 1030, the file or the database having been stored in an external recording medium such as the hard disk drive 1040, etc., and perform various types of processing on the data on the RAM 1030. The CPU 1010 may then write back the processed data to the external recording medium.

Various types of information, such as various types of programs, data, tables, and databases, may be stored in the recording medium to undergo information processing. The CPU 1010 may perform various types of processing on the data read from the RAM 1030, which includes various types of operations, processing of information, condition judging, conditional branch, unconditional branch, search/replace of information, etc., as described throughout this disclosure and designated by an instruction sequence of programs, and writes the result back to the RAM 1030. In addition, the CPU 1010 may search for information in a file, a database, etc., in the recording medium.

The above-explained program or software modules may be stored in the computer readable media on or near the computer 1000. In addition, a recording medium such as a hard disk or a RAM provided in a server system connected to a dedicated communication network or the Internet can be used as the computer readable media, thereby providing the program to the computer 1000 via the network 1080.

The present invention may be a system, a method, and/or a computer program product. The computer program product may include a computer readable storage medium having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to individualize the electronic circuitry, in order to perform aspects of the present invention. Especially, the fan-out switch functions of the present embodiments may be embedded into the neuromorphic chips by technique of the electronic circuitry.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can realize updating precise synaptic weights of an actual neuromorphic chip. With the invention, the device variability can be reduced without altering original scalable NVM array circuits, so it isn't needed to build special circuits to improve the resolution of the synaptic weight. When the resolution is not required to be so small, the rest of devices in the NVM array of the chip are available to implement remaining synaptic cells for network array other than the NVM array.

What is claimed is:

1. A neuromorphic chip, comprising:
   a plurality of synaptic cells including respective resistive devices;
   a plurality of axon lines and a plurality of dendrite lines connected to the synaptic cells to form a crossbar array, the axon lines being configured to receive input data and to supply the input data to the synaptic cells via a plurality of respective input lines, and the dendrite lines being configured to receive output data and to supply the output data via one or more respective output lines; and
   a plurality of switches each including an input terminal and one or more output terminals, a given one of the switches being configured to connect its input terminal to the plurality of input lines and to changeably connect its one or more output terminals to a given one or more of the axon lines according to a weight value accuracy requirement of a particular application being deployed on a neuromorphic system including the neuromorphic chip, the switches being configured to selectively assign and connect a single input line from each of two or more pre-synaptic neurons to one of the axon lines to assign, as a synaptic weight from a plurality of synaptic weights, one resistive cell, and to aggregate two or more axon lines from the plurality of axon lines for one output end of a single pre-synaptic neuron from the two or more pre-synaptic neurons, wherein the plurality of synaptic weights are initialized by setting randomized analog values to each of the synaptic cells.

2. The neuromorphic chip of claim 1, wherein the resistive devices are capable of holding a variable resistance value.

3. The neuromorphic chip of claim 2, wherein the resistive devices are capable of recording analog values.

4. The neuromorphic chip of claim 1, wherein the resistive devices include non-volatile memory.

5. The neuromorphic chip of claim 4, wherein the non-volatile memory includes phase change memory or flash memory.

6. The neuromorphic chip of claim 1, wherein the given switch changeably connects its one or more output terminals to the plurality of axon lines to assign a synaptic weight to a given one or more of the synaptic cells associated with the given one or more axon lines.

7. The neuromorphic chip of claim 6, wherein the given switch changeably connects its input terminal to the plurality of axon lines to supply the input data to the given one or more synaptic cells.

8. The neuromorphic chip of claim 7, wherein the plurality of axon lines include an adjacent pair of axon lines, and wherein the given switch changeably connects the input terminal to the adjacent pair of the axon lines to supply the input data to the given one or more synaptic cells.

9. The neuromorphic chip of claim 1, wherein the one or more pre-synaptic neurons are configured for supplying the input data to the axon lines via the switches, each of the pre-synaptic neurons having an input end and an output end, wherein the input terminal of the given switch respectively connects to the output end of a given one of the pre-synaptic neurons to supply the input data to the input terminal of the given switch.

10. The neuromorphic chip of claim 9, further comprising one or more post-synaptic neurons for receiving the output data from the dendrite lines, each of the post-synaptic neurons having an input end and an output end, wherein the input end of a given one of the post-synaptic neurons connects to a given one of the dendrite lines to receive the output data from the given dendrite line.

11. The neuromorphic chip of claim 10, further comprising a subsequent neuron layer configured to regard the post-synaptic neuron as a second pre-synaptic neuron for an input, the subsequent neuron layer being associated with a second plurality of synaptic cells including respective resistive devices between the second pre-synaptic neuron and a second post-synaptic neuron, the second plurality of synaptic cells being connected by the axon lines and the dendrite lines to form a second crossbar array, wherein the subsequent neuron layer receives the output data as second input data.

12. The neuromorphic chip of claim 1, wherein the switches are embedded into the neuromorphic chip by ASIC or FPGA circuits to streamline manufacturing the neuromorphic chip.

13. A neuromorphic system, comprising:
   a neuromorphic chip comprising:
      a plurality of synaptic cells including respective resistive devices;
      a plurality of axon lines and a plurality of dendrite lines connected to the synaptic cells to form a crossbar array, the axon lines being configured to receive input data and to supply the input data to the synaptic cells via a plurality of respective input lines, and the dendrite lines being configured to receive output data and to supply the output data via one or more respective output lines; and
      a plurality of switches each including an input terminal and one or more output terminals, a given one of the switches being configured to connect its input terminal to the plurality of input lines and to changeably connect its one or more output terminals to a given one or more of the axon lines, the switches being configured to selectively assign and connect a single input line from each of two or more pre-synaptic neurons to one of the axon lines to assign, as a synaptic weight from a plurality of synaptic weights, one resistive cell, and to aggregate two or more axon lines from the plurality of axon lines for one output end of a single pre-synaptic neuron from the two or more pre-synaptic neurons, wherein the plurality of synaptic weights are initialized by setting randomized analog values to each of the synaptic cells; and
   a hardware processor operatively connected to a computer-readable medium, the processor being operatively coupled to the neuromorphic chip and configured to:
      enable the given switch to changeably connect its input line to the plurality of axon lines according to a weight value accuracy requirement of a particular application being deployed on the neuromorphic system; and
      perform a learning operation with the input data via the plurality of axon lines by expressing a single weight with a preferred number of resistive elements of the synaptic cells.

14. The neuromorphic system of claim 13, further comprising a database connected to a controller for supplying the input data to the plurality of axon lines during the learning operation.

15. The neuromorphic system of claim 13, wherein the processor is further configured to compare the output data to expected output data, and output a difference between the output data and the expected output data as an error.

16. The neuromorphic system of claim 15, wherein the expected output data is obtained from the processor.

17. The neuromorphic system of claim 13, further comprising:
   one or more pre-synaptic neurons for supplying the input data to the axon lines via the switches, each of the pre-synaptic neurons having an input end and an output end, wherein the input terminal of the given switch respectively connects to the output end of a given one of the pre-synaptic neurons to supply the input data to the input terminal of the given switch; and
   one or more post-synaptic neurons for receiving the output data from the dendrite lines, each of the post-synaptic neurons having an input end and an output end, wherein the input end of a given one of the post-synaptic neurons connects to a given one of the dendrite lines to receive the output data from the given dendrite line.

18. A method for updating synaptic weights in a neuromorphic chip, comprising:
   connecting respective input terminals of a plurality of switches of the neuromorphic chip to input lines of the neuromorphic chip; and
   for a given one of the switches, assigning and changeably connecting one or more of the plurality of switches to one of a plurality of axon lines of the neuromorphic chip to assign a synaptic weight to a given one or more of a plurality of synaptic cells of the neuromorphic chip, the axon lines being configured to receive input data from a given one or more of the input lines and to supply the input data to the given one or more synaptic cells via a plurality of respective input lines, the switches being configured to selectively connect each of one or more input lines of one or more pre-synaptic neurons to one of the axon lines to assign, as a synaptic weight from a plurality of synaptic weights, one resistive cell, and to aggregate two or more axon lines from the plurality of axon lines for one output end of the two or more pre-synaptic neurons, wherein the plurality of synaptic weights are initialized by setting randomized analog values to each of the synaptic cells, the given switch changeably connecting to the axon lines according to a weight value accuracy requirement of a particular application being deployed on a neuromorphic system including the neuromorphic chip;
   wherein the synaptic cells are connected to the axon lines and a plurality of dendrite lines of the neuromorphic chip to form a crossbar array.

19. The method of claim 18, further comprising performing a learning operation with the input data via the axons lines by expressing the weight with a preferred number of resistive elements of the given one or more synaptic cells.

20. A computer program product comprising a computer readable storage medium having program instructions embodied therewith, the program instructions executable by the switches to cause the switches to perform the method of claim 18.

* * * * *